(12) United States Patent
Hol et al.

(10) Patent No.: US 8,896,811 B2
(45) Date of Patent: Nov. 25, 2014

(54) POSITIONING SYSTEM AND A METHOD FOR POSITIONING A SUBSTAGE WITH RESPECT TO A FRAME

(75) Inventors: Sven Antoin Johan Hol, Eindhoven (NL); Jan Van Eijk, Eindhoven (NL); Antonius Franciscus Johannes De Groot, Someren (NL); Johannes Petrus Martinus Bernardus Vermeulen, Helmond (NL); Geert-Jan Petrus Naaijkens, Eindhoven (NL); Marijn Kessels, Geldrop (NL); Daniël Godfried Emma Hobbelen, Amsterdam (NL)

(73) Assignee: ASML Netherlands B.V., Veldhoven (NL)

( * ) Notice: Subject to any disclaimer, the term of this patent is extended or adjusted under 35 U.S.C. 154(b) by 1004 days.

(21) Appl. No.: 12/853,916

(22) Filed: Aug. 10, 2010

(65) Prior Publication Data

US 2011/0075122 A1    Mar. 31, 2011

Related U.S. Application Data

(60) Provisional application No. 61/233,374, filed on Aug. 12, 2009.

(51) Int. Cl.
*G03B 27/42* (2006.01)
*G03F 7/20* (2006.01)

(52) U.S. Cl.
CPC .................................. *G03F 7/70758* (2013.01)
USPC .................................. 355/53; 355/72; 355/77

(58) Field of Classification Search
CPC . G03F 7/70758; G03F 7/70716; G03F 7/707; G03F 7/70725; G03F 7/70775; H02K 2201/18; H02K 41/0354; H02K 11/0005; H02K 3/04; H02K 41/02; B23Q 3/1546; G05B 2219/36585; G05B 2219/42173; H01F 2027/2857; H01F 5/00; H01F 21/68; H01F 21/6831
USPC ........................................... 355/30, 53, 72, 77
See application file for complete search history.

(56) References Cited

U.S. PATENT DOCUMENTS

| | | | |
|---|---|---|---|
| 7,016,020 B2 | 3/2006 | Schmidt | |
| 2005/0030503 A1* | 2/2005 | De Weerdt | ...................... 355/53 |
| 2005/0200825 A1 | 9/2005 | Schmidt | |
| 2007/0279644 A1* | 12/2007 | Teun Plug et al. | ............. 356/625 |

FOREIGN PATENT DOCUMENTS

| | | |
|---|---|---|
| JP | 06-241274 | 8/1994 |
| JP | 2000-193025 | 7/2000 |

(Continued)

OTHER PUBLICATIONS

Japanese Office Action mailed Mar. 19, 2013 in corresponding Japanese Patent Application No. 2010-173783.

*Primary Examiner* — Mesfin T Asfaw
(74) *Attorney, Agent, or Firm* — Pillsbury Winthrop Shaw Pittman LLP

(57) ABSTRACT

A method for positioning a substage, supported by a main stage, relative to a reference object, the substage moveable in a direction between a first and second position relative to the main stage. The method includes positioning the first stage using a passive force system that is activated by positioning the main stage. The passive force system includes two magnet systems, each magnet system being configured to apply a force in the direction to the first stage with respect to the second stage in a non-contact manner, the forces resulting in a resultant force applied to the first stage in the direction by the passive force system. A magnitude and/or a direction of the resultant force depends on the position of the first stage relative to the second stage, and the first stage has a zero-force position between the first and second position in which the resultant force is zero.

20 Claims, 4 Drawing Sheets

(56) References Cited

FOREIGN PATENT DOCUMENTS

| JP | 2000-223410 | 8/2000 |
| JP | 2001-012544 | 1/2001 |
| JP | 2005-251788 | 9/2005 |
| JP | 2005-317926 | 11/2005 |
| JP | 2008-010643 | 1/2008 |
| JP | 2008-172137 | 7/2008 |

* cited by examiner

POSITIONING SYSTEM AND A METHOD FOR POSITIONING A SUBSTAGE WITH RESPECT TO A FRAME

CROSS REFERENCE TO RELATED APPLICATIONS

This application claims priority and benefit under 35 U.S.C. §119(e) to U.S. Provisional Patent Application No. 61/233,374, entitled "A Positioning System and A Method For Positioning A Substage With Respect To A Frame", filed on Aug. 12, 2009. The content of that application is incorporated herein in its entirety by reference.

FIELD

The present invention relates to a positioning system, in particular for a lithographic apparatus, and a method for positioning a substage with respect to a frame.

BACKGROUND

A lithographic apparatus is a machine that applies a desired pattern onto a substrate, usually onto a target portion of the substrate. A lithographic apparatus can be used, for example, in the manufacture of integrated circuits (ICs). In such a case, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Conventional lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

A lithographic apparatus may include a positioning system to position a moveable object, such as a substage with respect to a reference object, e.g. a metrology frame or a main frame. The substage may be or include a support structure to hold the substrate or patterning device.

Usually, the positioning system includes a main stage which is moveable with respect to a frame in a moving direction, wherein the substage is moveable in the moving direction between a first and a second position relative to the main stage. The substage may be supported by the main stage. Generally, a long stroke actuator is provided between the frame and the main stage as a first actuator to apply a force to the main stage with respect to the frame in the moving direction, and a short stroke actuator is provided between the main stage and the substage as a second actuator to apply a force to the substage with respect to the main stage in the moving direction. The long stroke actuator is used for coarse positioning of the main stage and substage, and the short stroke actuator is used for fine positioning of the substage relative to the main stage. The short stroke actuator may be a moving magnet system in which the stator, i.e. a part of the main stage, includes a coil system which is surrounded by a mover, i.e. a part of the substage, which includes magnets incorporated in magnetically highly permeable metal in order to achieve high magnetic field densities.

With this configuration, when the long stroke actuator accelerates the main stage with a certain acceleration, the short stroke actuator also has to apply a force between the substage and the main stage to accelerate the substage with the same amount. The force to accelerate the substage is in fact generated twice, once by the long stroke actuator and once by the short stroke actuator. As a consequence, the short stroke actuator is designed in accordance with these demands, resulting in a relatively large and heavy short stroke actuator and thus a relatively high mass of the substage, so that an even larger force has to be generated to accelerate the substage. Also, when the substage is accelerated with a certain amount, a lot of heat is generated by the short stroke actuator in or near the substage which causes structural deformations resulting in e.g. a loss of position measurement accuracy and deformation of the patterning device or substrate on top of the substage.

To cool the substage, hoses carrying a cooling fluid may be provided between the substage and the main stage or frame, thereby introducing force disturbances that limit the position accuracy of the positioning system.

SUMMARY

It is desirable to provide an improved positioning system.

According to an embodiment of the invention, there is provided a method to position a substage with respect to a reference object with:

a main stage which is moveable with respect to a frame in a moving direction, the substage being moveable in the moving direction between a first and a second position relative to the main stage;

a main actuator between the main stage and the frame for applying a force to the main stage with respect to the frame in the moving direction; and a passive force system between the substage and the main stage, including at least two magnet systems, each magnet system being configured to apply a force in the moving direction to the substage with respect to the main stage in a non-contact manner, the forces resulting in a resultant force applied to the substage in the moving direction by the passive force system, wherein a magnitude and/or a direction of the resultant force depends on the position of the substage relative to the main stage, and wherein the substage has a zero-force position between the first and second position in which the resultant force has a zero magnitude, and wherein the substage is positioned with respect to the reference object in or near a desired position with the passive force system by positioning the main stage relative to the frame with the main actuator.

According to another embodiment of the invention, there is provided a positioning system including:

a main stage which is moveable with respect to a frame in a moving direction;

a substage which is moveable in the moving direction between a first and a second position relative to the main stage;

a main actuator to apply a force to the main stage with respect to the frame in the moving direction;

a passive force system between the substage and the main stage, including at least two magnet systems, each magnet system being configured to apply a force in the moving direction to the substage with respect to the main stage in a non-contact manner, the forces resulting in a resultant force applied to the substage in the moving direction by the passive force system, wherein a magnitude and/or a direction of the resultant force depends on the position of the substage relative to the main stage;

and wherein the substage has a zero-force position between the first and second position in which the resultant force has a zero magnitude, the positioning system further including:

a control system configured to position the substage with respect to a reference object in or near a desired position with the passive force system by positioning the main stage relative to the frame with the main actuator.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
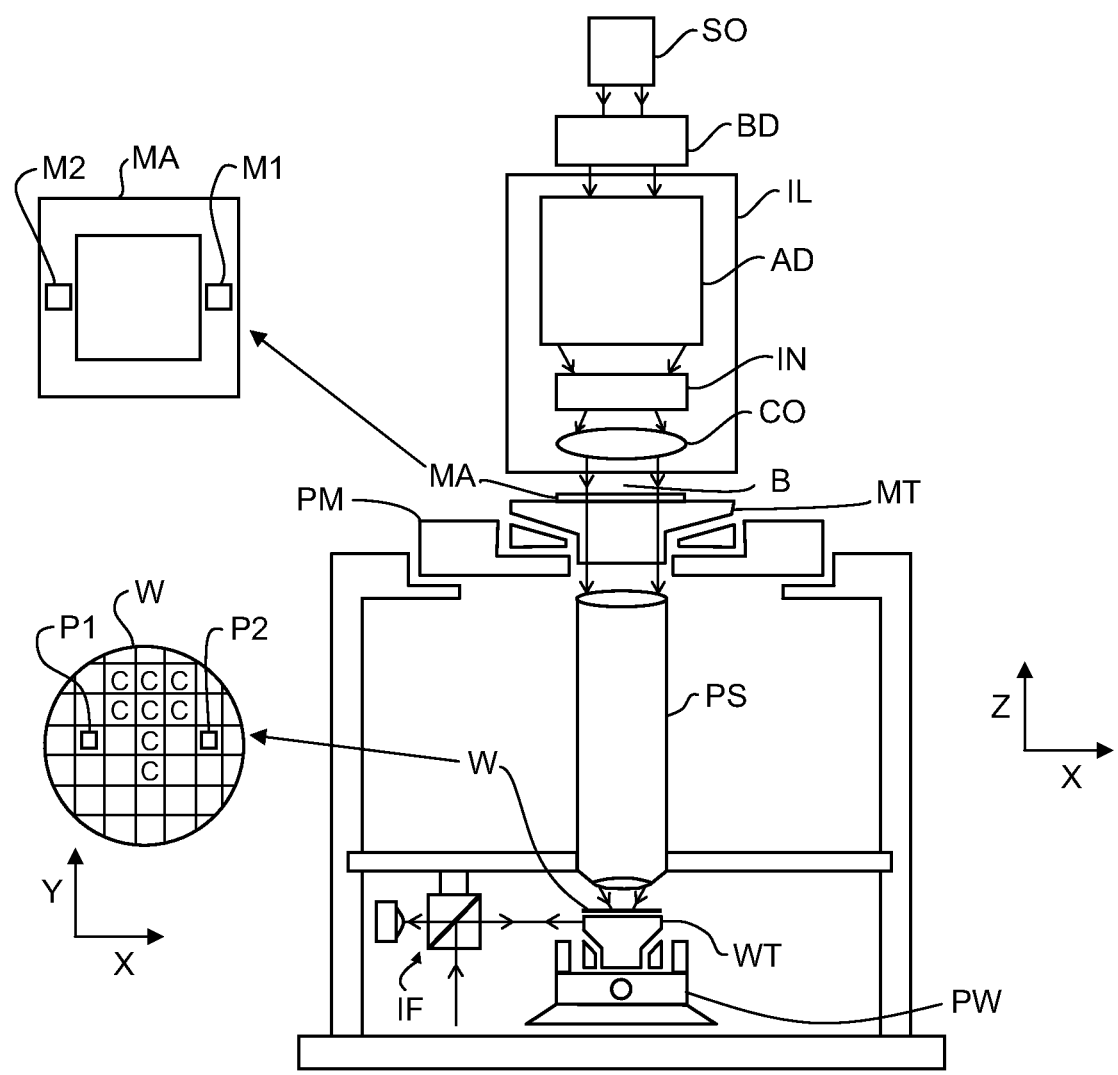
FIG. 1 depicts a lithographic apparatus according to an embodiment of the invention.

FIG. 1 schematically depicts a lithographic apparatus according to one embodiment of the invention. The apparatus includes an illumination system (illuminator) IL configured to condition a radiation beam B (e.g. UV radiation or any other suitable radiation), a patterning device support or mask support structure (e.g. a mask table) MT constructed to support a patterning device (e.g. a mask) MA and connected to a first positioning device PM configured to accurately position the patterning device in accordance with certain parameters. The apparatus also includes a substrate table (e.g. a wafer table) WT or "substrate support" constructed to hold a substrate (e.g. a resist-coated wafer) W and connected to a second positioning device PW configured to accurately position the substrate in accordance with certain parameters. The apparatus further includes a projection system (e.g. a refractive projection lens system) PS configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, to direct, shape, or control radiation.

The patterning device support holds the patterning device in a manner that depends on the orientation of the patterning device, the design of the lithographic apparatus, and other conditions, such as for example whether or not the patterning device is held in a vacuum environment. The patterning device support can use mechanical, vacuum, electrostatic or other clamping techniques to hold the patterning device. The patterning device support may be a frame or a table, for example, which may be fixed or movable as required. The patterning device support may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section so as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables or "substrate supports" (and/or two or more mask tables or "mask supports"). In such "multiple stage" machines the additional tables or supports may be used in parallel, or preparatory steps may be carried out on one or more tables or supports while one or more other tables or supports are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the patterning device (e.g. mask) and the projection system. Immersion techniques can be used to increase the numerical aperture of projection systems. The term "immersion" as used herein does not mean that a structure, such as a substrate, must be submerged in liquid, but rather only means that a liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device (e.g., mask) MA, which is held on the patterning device support (e.g., mask table) MT, and is patterned by the patterning device. Having traversed the patterning device (e.g. mask) MA, the radiation beam B passes through the projection system PS, which focuses the beam onto a target portion C of the substrate W. With the aid of the second positioning device PW and position sensor IF (e.g. an interferometric device, linear encoder or capacitive sensor), the substrate table WT can be moved accurately, e.g. so as to position different target portions C in the path of the radiation beam B. Similarly, the first positioning device PM and another position sensor (which is not explicitly depicted in FIG. 1) can be used to accurately position the patterning device (e.g. mask) MA with respect to the path of the radiation beam B, e.g. after mechanical retrieval from a mask library, or during a scan.

Patterning device (e.g. mask) MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device (e.g. mask) MA, the patterning device alignment marks may be located between the dies.

The depicted apparatus could be used in at least one of the following modes:

1. In step mode, the patterning device support (e.g. mask table) MT or "mask support" and the substrate table WT or "substrate support" are kept essentially stationary, while an entire pattern imparted to the radiation beam is projected onto a target portion C at one time (i.e. a single static exposure). The substrate table WT or "substrate support" is then shifted in the X and/or Y direction so that a different target portion C can be exposed. In step mode, the maximum size of the exposure field limits the size of the target portion C imaged in a single static exposure.

2. In scan mode, the patterning device support (e.g. mask table) MT or "mask support" and the substrate table WT or "substrate support" are scanned synchronously while a pattern imparted to the radiation beam is projected onto a target portion C (i.e. a single dynamic exposure). The velocity and direction of the substrate table WT or "substrate support" relative to the patterning device support (e.g. mask table) MT or "mask support" may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the patterning device support (e.g. mask table) MT or "mask support" is kept essentially stationary holding a programmable patterning device, and the substrate table WT or "substrate support" is moved or scanned while a pattern imparted to the radiation beam is projected onto a target portion C. In this mode, generally a pulsed radiation source is employed and the programmable patterning device is updated as required after each movement of the substrate table WT or "substrate support" or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Embodiments of the first and/or second positioning devices PM, PW will now be described in more detail with reference to FIGS. 2-6. These embodiments are not limited to the first and second positioning devices PM, PW, but serve as an example that may be applied for other applications as well.

Figure 2:
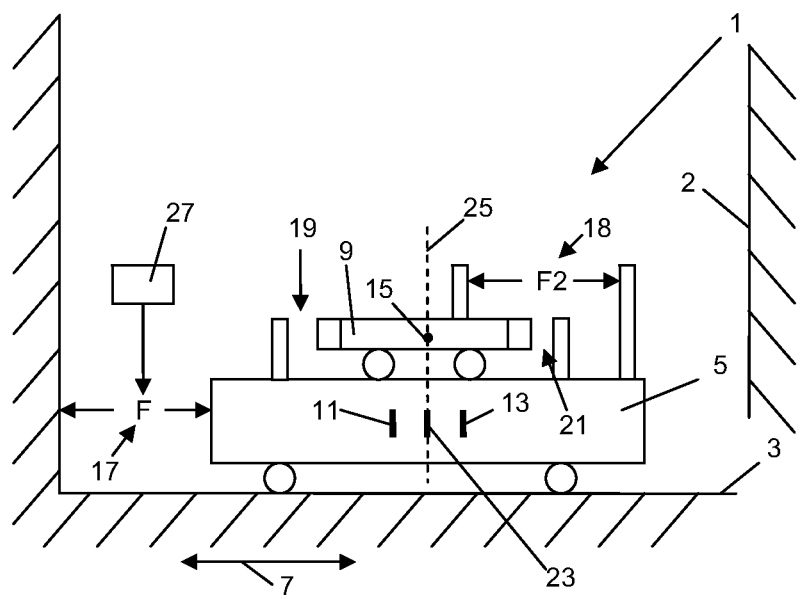
FIG. 2 depicts a positioning system according to another embodiment of the invention.

FIG. 2 shows a schematic representation of a positioning system 1 according to an embodiment of the invention. The positioning system 1 includes a frame 3, which can be a support frame or a base frame of the lithographic apparatus of FIG. 1.

The positioning system 1 further includes a main stage 5 which is moveable with respect to the frame 3 in a moving direction 7, and a substage 9 which is moveable in the moving direction 7 between a first position 11 and a second position 13 relative to the main stage 5. The position of the substage 9 with respect to the main stage 5 is indicated by the position of a centre of gravity 15 of the substage 9. The first and second position 11,13 are therefore indicated on the main stage 5 and define the stroke possible for the centre of gravity 15 of the substage 9. To make it easier to see the relative position of the centre of gravity 15 with respect to the main stage 5, a dashed line 25 is drawn through the centre of gravity 15.

The substage 9 may be a substrate or patterning device support and is in this embodiment supported by the main stage 5. However, an embodiment in which both the substage 9 and main stage 5 are supported by the frame 3 is also envisaged. The substage 9 and main stage 5 can be broadly termed a first and a second stage, respectively.

Between the main stage 5 and the frame 3, a main actuator 17 is provided to apply a force F to the main stage 5 with respect to the frame 3 in the moving direction 7. The main actuator 17 may be a moving magnet system with a coil system which cooperates with a permanent magnet system, wherein for instance the coil system is located on the frame 3 and the permanent magnet system is located on the main stage 5. The main actuator 17 may also be a moving coil system, in which the coil system is located on the main stage 5 and the permanent magnet system is located on the frame 3.

Between the main stage 5 and the substage 9, a passive force system is provided, including two magnet systems 19,21, wherein each magnet system 19,21 is configured to apply a force in the moving direction to the substage 9 with respect to the main stage 5 in a non-contact manner. The forces of the magnet systems 19,21 result in a resultant force, i.e. a vector sum of the forces, applied to the substage 9 in the moving direction by the passive force system, wherein a magnitude and/or a direction of the resultant force depends on the position of the substage 9 relative to the main stage 5.

The substage 5 has a zero-force position 23 between the first and second position 11,13 in which the resultant force has a zero magnitude. The zero-force position 23 is also indicated on the main stage 5. In FIG. 2, the substage 9 is shown in the zero-force position 23.

The positioning system 1 also includes a controller or control system 27 which is configured to position the substage 9 with respect to a reference object 2 in or near a desired position with the passive force system by positioning the main stage 5 relative to the frame 3 with the main actuator 17. The desired position can be any position with respect to the reference object 2 and may also be defined as a desired trajectory or as a desired velocity, acceleration, jerk, etc. The reference object 2 may be connected to the frame 3 or may be a separate object, for instance, the frame 3 may be a base frame, and the reference object may be a metrology frame.

The control system 27 may include at least one sensor to measure a position quantity of the substage and/or the main stage, wherein the control system 27 is configured to provide a drive signal to the main actuator on the basis of a desired position quantity and an output of the at least one sensor. Preferably, the at least one sensor measure the position quantity of the substage and the main stage with respect to the reference object 2, as this also provides a measure for the position of the substage relative to the main stage. It is however also envisaged that the position quantity of the main stage is measured with respect to the substage. However, a combination is also possible.

The magnet systems 19,21 include passive magnetic elements, such as permanent magnets and/or elements including magnetizable material.

By moving the main stage 5 for instance to the right in FIG. 2 with the main actuator, the substage 9 will move towards the first position with respect to the main stage 5. This will generate a non-zero resultant force on the substage 9 which can be used to position the substage with respect to the reference object 2. As the magnitude and/or the direction of the resultant force can be adjusted by setting the appropriate relative position of the substage with respect to the main stage, full control of the position of the substage with respect to the reference object 2 can be established.

A benefit of positioning the substage in a passive manner is that no heat is generated in or near the substage for the generation of forces, so that deformation of the substage and components like substrates and patterning devices on top of the substage is decreased. As there is no or at least less heat generated on the substage, cooling devices such as hoses carrying cooling fluids may also be omitted, resulting in less force disturbances and thus an improved position accuracy.

Another benefit may be that the total mass of the main stage and/or substage is decreased with respect to the case that an active magnet-coil system is used. A lower mass results in a faster positioning system for the same energy input.

For accurate positioning, the positioning system 1 may include a second actuator 18 between the substage and the main stage to apply a force F2 to the substage 9 with respect to the main stage 5 in the moving direction. The benefit of the passive force system is that the second actuator 18 can be designed relatively small as it only has to apply forces F2 to fine position the substage and suppress disturbances, which forces are smaller than the forces for coarse positioning and are applied by the passive force system. It is noted here explicitly that the presence of a second actuator 18 is not essential for the invention.

A stiffness of the passive force system is the rate of change of the magnitude of the resultant force with respect to a change in position of the substage relative to the main stage, i.e. in the moving direction. In an embodiment, the magnet systems are designed such that a magnitude of the stiffness in the zero-force position is less than the magnitude of the stiffness near the first or second position, i.e. the magnitude of the stiffness is minimal in the zero-force position and increases towards the first and second position. This means that when a second actuator is used for fine positioning in the zero-force position, the interference between the second actuator and the passive force system is minimized in the zero-force position, while the larger stiffness near the first and second position can beneficially be used for coarse positioning.

Figure 4:
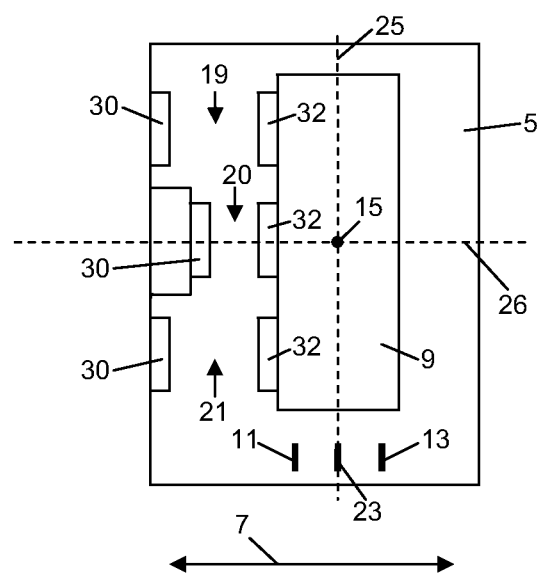
FIG. 4 depicts another embodiment of a passive force system of the positioning system of FIG. 2.
Figure 3:
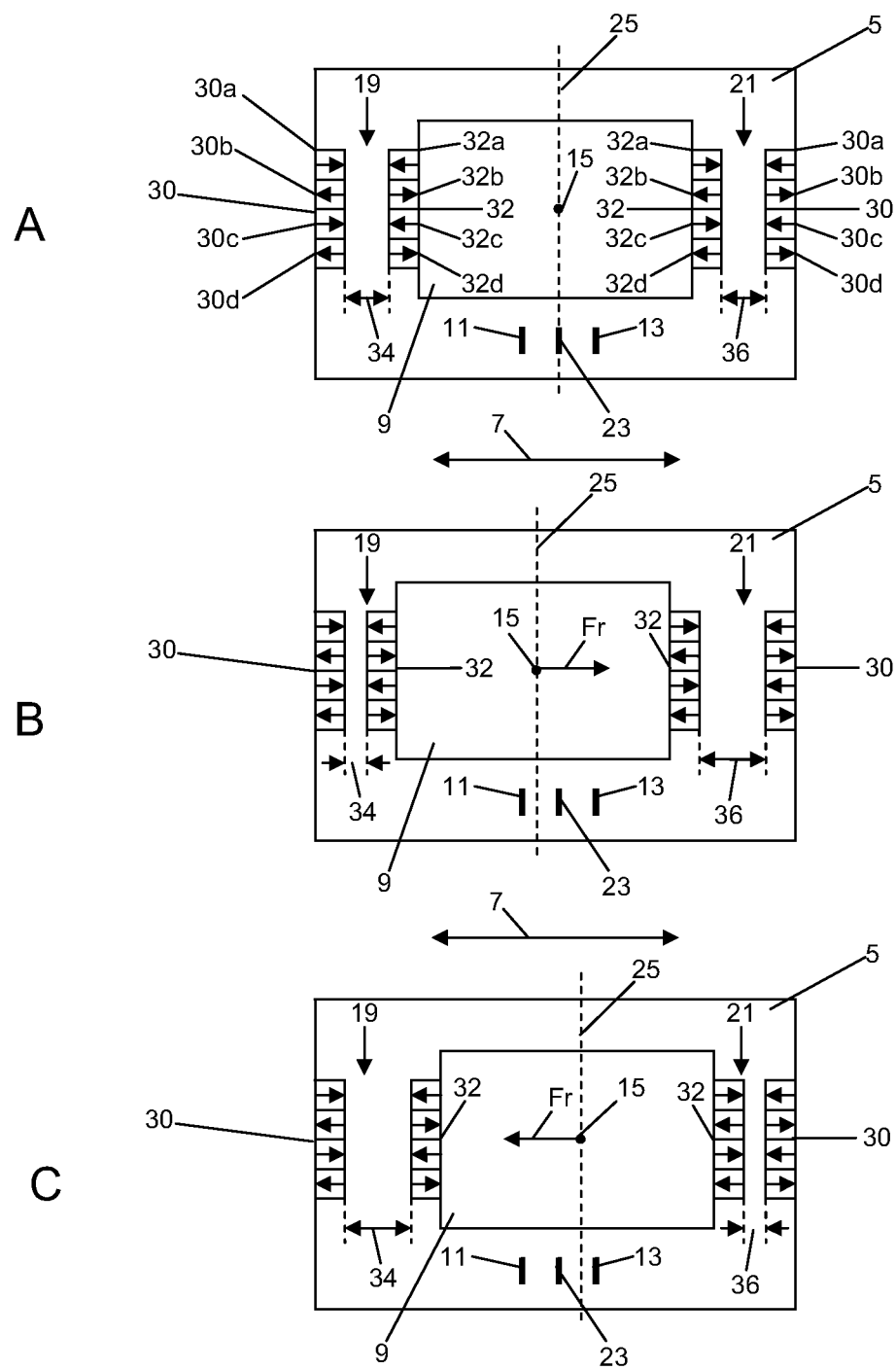
FIG. 3 depicts an embodiment of a passive force system of the positioning system of FIG. 2.
Figure 5:
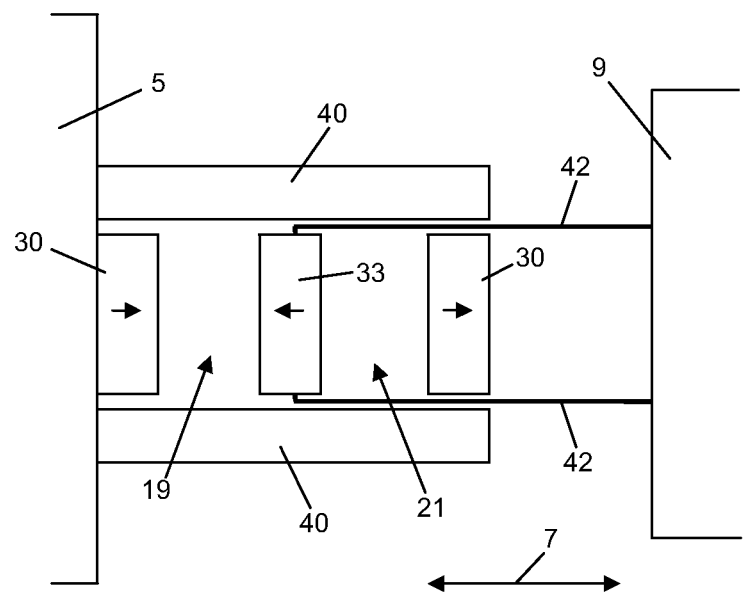
FIG. 5 depicts yet another embodiment of a passive force system of the positioning system of FIG. 2.

FIGS. 3-5 will now show in more detail alternative embodiments of the passive force system of the positioning system of FIG. 2.

FIG. 3 depicts a part of the positioning system 1 of FIG. 2, in particular the main stage 5 and the substage 9 from above in three situations A,B,C. The passive force system includes two magnet systems 19,21, wherein each of the magnet systems 19,21 includes a main stage magnet assembly 30 attached to the main stage 5, and a substage magnet assembly 32 attached to the substage 9.

Each main stage magnet assembly and substage magnet assembly includes a one-dimensional array of permanent magnets 30a-30d and 32a-32d respectively. A magnetic polarization of the permanent magnets is indicated by an arrow drawn inside each permanent magnet. Adjacent permanent magnets in the array have opposite magnetic polarizations, as have a permanent magnet of the main stage magnet assembly and an associated opposite permanent magnet of the substage magnet assembly, compare for example permanent magnet 30a and 32a. The main stage magnet assembly 30 and the substage magnet assembly 32 of each magnet system 19,21 are thus configured to repulse each other.

It is noted here, that an embodiment with a two-dimensional array, in which adjacent permanent magnets have opposite magnetic polarization is also possible. For simplicity reasons, the linear array embodiment is described here as an example.

The main stage magnet assembly 30 and the substage magnet assembly 32 of each magnet system 19,21 are oriented opposite to each other in the moving direction 7. In particular, magnet systems 19 and 21 are symmetric about a line, in this case line 25 through the centre of gravity 15, of the substage when the substage is in the zero-force position 23. Magnet system 19 therefore applies a force to the substage in a positive direction of the moving direction 7, i.e. to the right in FIG. 3, which is opposite to a force applied to the substage by the magnet system 21. The magnitude of the forces depends on the relative position of the substage with respect to the main stage.

In situation A, the substage is in the zero-force position relative to the main stage, so that a gap 34 between the main stage magnet assembly 30 and the substage magnet assembly 32 of magnet system 19 is equal to a gap 36 between the main stage magnet assembly 30 and the substage magnet assembly 32 of magnet system 21, so that the forces applied to the substage by the magnet systems balance each other in the moving direction and a resultant force in the moving direction has a zero magnitude, i.e. is absent.

In situation B, the main stage 5 has been positioned by the control system such that the substage 9 is in a position between the first position 11 and the zero-force position 23 as indicated by line 25 through the centre of gravity 15 of the substage. As a result, the gap 34 is smaller than the gap 36, so that the repulsive force of magnet system 19 is larger than the repulsive force of magnet system 21. As a result, a resultant force Fr is applied to the substage in the moving direction towards the zero-force position. By positioning the substage in this position relative to the main stage, the substage can be accelerated to the right, i.e. the positive direction of the moving direction.

In situation C, the main stage 5 has been positioned by the control system such that the substage 9 is in a position between the zero-force position 23 and the second position 13 as indicated by line 25 through the centre of gravity 15 of the substage. As a result, the gap 36 is smaller than the gap 34, so that the repulsive force of magnet system 19 is smaller than the repulsive force of magnet system 21. As a result, a resultant force Fr is applied to the substage in the moving direction towards the zero-force position. By positioning the substage in this position relative to the main stage, the substage can be accelerated to the left, i.e. a negative direction of the moving direction.

The benefit of the embodiment according to FIG. 3 is that the gaps 34,36 can be relatively small while keeping the magnitude of the stiffness of the passive force system in the zero-force position minimal. This is caused by the opposite polarization of adjacent magnets in a magnet assembly. A small gap 34,36 is preferred as this requires less effort of the main actuator to position the main stage with respect to the frame such that a desired resultant force is applied to the substage. When a desired force is required, only a small relative movement is sufficient. A minimal stiffness in the zero-force position is beneficial for fine positioning the substage with respect to the frame as there is less interference between the passive force system and a possible second actuator intended for fine positioning of the substage. It also allows less accurate positioning of the main stage relative to the substage as a small position error will not result in a large force error applied to the substage.

By providing magnet assemblies 30,32 in which adjacent magnets have opposite polarizations, the magnetic field strength at a distance of the magnet assemblies is decreased with respect to for instance the situation in which the polarizations are parallel, so that the gap 34,36 can be made smaller for the same magnitude of stiffness in the zero-force position.

The magnitude of the stiffness can also be influenced by the size of the magnets, in particular the magnet pole pitch. The sensitivity to demagnetization and force magnitude can be adjusted by setting a thickness of the magnets. A person skilled in the art can thus design a magnet configuration such that the sensitivity to demagnetization is low and set the magnitude of the stiffness as low as possible as is required for the system.

In an embodiment of the invention the configuration of the magnet system 19 and 21 as shown in FIG. 3 indicates two time four magnets, but the number of magnets per magnet stack and the stator pole distance as indicated by references 34, 36 may be varied while optimizing different design parameters as described above. Finite element simulations indicate for example other beneficial configurations depending on such specific requirements while varying the number of magnets per magnet stacks and the stator pole distance. The requirements for a specific configuration may depend on the required maximum resultant force (Fr), the stator pole distance relating the relative movement between the substage 9 and the main stage 5, the desired stiffness of the magnetic system at maximum force distance (referring to FIG. 3B and FIG. 3C) and the desired stiffness of the magnetic system at zero force distance (referring to FIG. 3A). Some examples of possible configurations and the resulting design parameters based on finite element simulations are shown in the following table, but other magnet stack configurations may also be possible:

| 4 magnets per stack (maximum force 680 [N]) | | | | |
|---|---|---|---|---|
| Stator pole distance [mm] | 22 | 32 | 42 | 62 |
| Stiffness at maximum force distance [N/m] | 2.3E5 | 2.3E5 | 2.3E5 | 2.3E5 |
| Stiffness at zero force distance [N/m] | 13000 | 2700 | 770 | 150 |
| 10 magnets per stack (maximum force 520 [N]) | | | | |
| Stator pole distance [mm] | 12 | 22 | 32 | 42 |
| Stiffness at maximum force distance [N/m] | 3.2E5 | 3.2E5 | 3.2E5 | 3.2E5 |
| Stiffness at zero force distance [N/m] | 11150 | 650 | 180 | 80 |
| 12 magnets per stack (maximum force 430 [N]) | | | | |
| Stator pole distance [mm] | 12 | 22 | 32 | 42 |
| Stiffness at maximum force distance [N/m] | 3.2E5 | 3.2E5 | 3.2E5 | 3.2E5 |
| Stiffness at zero force distance [N/m] | 5500 | 400 | 125 | 51 |

The configuration of FIG. 3 of the magnet systems could also be adapted so that the main stage magnet assembly 30 and the substage magnet assembly 32 attract each other. The consequence is that the resultant forces in situations B and C are opposite to the shown resultant forces and thus the direction of the resultant force Fr is towards the first position and second position respectively for situation B and C. As this system is inherently unstable, this requires a control scheme configured for an unstable system as is known to a person skilled in the art of control to make the total system stable.

FIG. 4 shows an another alternative embodiment for the passive force system. The substage is only shown in the zero-force position as the general working principle is similar to the embodiment of FIG. 3. The passive force system of this embodiment includes three magnet systems 19-21, each magnet system including a substage magnet assembly 32 attached to the substage 9, and a main stage magnet assembly 30 attached to the main stage 5. The main stage magnet assembly 30 and the substage magnet assembly 32 of the magnet system 20 are configured to repulse each other. The main stage magnet assembly 30 and the substage magnet assembly 32 of the magnet systems 19,21 are configured to attract each other.

The magnet systems 19-21 are positioned symmetric about a line 26 through the centre of gravity 15, so that the forces applied to the substage by the magnet systems will not result in a rotation of the substage about an axis perpendicular to the drawing plane. The above described symmetry is not mandatory, especially not if rotation is desired or is no issue, for instance due to the presence of a guide system.

Due to the difference in gap between the magnet systems 19, 21 and the magnet system 20, the repulsive force of magnet system 20 will increase more then the attractive forces of magnet systems 19,21 when the substage moves relatively towards the first position 11, so that a resultant force is then applied to the substage which is directed to the zero-force position. When the substage is moved relatively towards the second position, the repulsive force of magnet system 20 will decrease more than the attractive forces of magnet systems 19,21, so that a resultant force is applied to the substage, which is directed to the zero-force position.

Also for this configuration, the magnet systems can be adapted so that for instance the magnet systems 19, 21 apply a repulsive force, and magnet system 20 applies an attractive force. It is also possible to change the gaps between the main stage magnet assemblies 30 and the substage magnet assemblies 32, so that the gap of magnet system 20 is larger than the gap of magnet systems 19,21. Such adaptations may also require a change in strength of the permanent magnets of the magnet systems and/or another control scheme of the control system when for instance the system becomes unstable.

FIG. 5 depicts an alternative embodiment of a passive force system according to the invention. The passive force system includes two magnet systems 19,21, each magnet system configured to apply a force in the moving direction to a substage 9 with respect to a main stage 5 in a non-contact manner. Each magnet system 19,21 includes a main stage magnet assembly 30 attached to the main stage 5 and a substage magnet assembly attached to the substage. In this embodiment, the substage magnet assemblies of the magnet systems 19,21 are integrated, i.e. combined, into one single substage magnet assembly 33. In this example, a magnet assembly 30,33 includes one permanent magnet, wherein the magnetic polarization of the magnet is indicated by an arrow drawn inside the permanent magnets. The magnet assemblies are thus configured to repulse each other. The magnet assemblies however, may also be configured similar to the magnet assemblies of FIG. 3 and include multiple magnets in which adjacent magnets have opposite polarizations.

Substage magnet assembly 33 is attached to the substage 9 via links 42. A similar passive force system as shown in FIG. 5 may also be provided on the opposite side of the substage 9 seen in the moving direction 7.

Guides 40 are provided to guide movement of the substage magnet assembly 33 and thus of the substage 9. Between the guides 40 and the substage magnet assembly 33 or the links 42 a bearing, such as an air bearing may be provided. This may also be beneficial to suppress a stiffness of the magnet systems in directions perpendicular to the moving direction.

Figure 6:
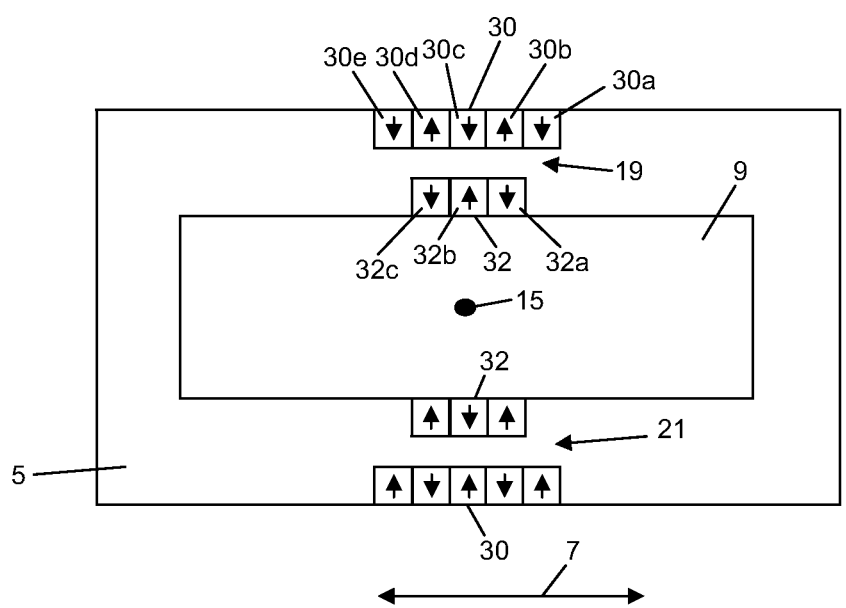
FIG. 6 depicts a further embodiment of a passive force system of the positioning system of FIG. 2.

FIG. 6 depicts another alternative embodiment of a passive force system according to the invention. Shown is a main stage 5 and a substage 9 which is moveable with respect to the main stage 5. The passive force system includes two magnet systems 19, 21, each being positioned on opposite sides of the substage 9 seen in a direction perpendicular to a moving direction 7. Each magnet system includes a main stage magnet assembly 30 attached to the main stage 5 with, for example, five permanent magnets 30a-30e of which a magnetic polarization is indicated by arrows in the magnets. Each magnet system also includes a substage magnet assembly 32 attached to the substage 9 with, for example, three permanent magnets 32a-32c of which the magnetic polarization is indicated by arrows in the magnets.

The substage 9 is shown in a zero-force position with respect to the main stage 5. The magnet assemblies are configured to repulse each other in this position. It is noted here that the magnet configuration results in an unstable zero-force position, so that when the substage is slightly moved to the left or right, the magnet assemblies will align themselves into a position that they attract each other. The force in the moving direction that tends to align the magnet assemblies can be used to position the substage 9 relative to a frame 3. In fact, each system shown in FIGS. 3-5 may also have a similar behavior in a direction substantially perpendicular to the moving direction, so that the passive force system can also be used to position the substage 9 in another direction. So two-dimensional positioning is also possible without altering the structural features of the passive force system. The configuration of the control system may have to be adapted for the two-dimensional case, as in that case the main actuator may have to position the main stage in two directions as well. For this embodiment, it is desirable that the moving range of the substage be limited to the magnetic pole pitch in order to keep control of the position relatively simple.

The magnet assemblies have been shown as a single permanent magnet (FIG. 5) and as a one dimensional array (FIGS. 3 and 6), but it is also envisaged that other configurations are used, such as two-dimensional arrays, including Halbach configurations. It is also noted that the configuration of the substage magnet assembly does not necessarily have to be equal to the configuration of the main stage magnet assembly. One of them may have a Halbach configuration and the other one may not.

It has been theoretically shown that a configuration with a one-dimensional array has the benefit that a stiffness in at least one direction substantially perpendicular to the moving direction can be minimized while maintaining a good characteristic in the moving direction.

It is further noted that features described for particular embodiments may also be beneficially applied to other embodiments and that the shown embodiments are not limited to the specific design choices. As an example, the shown embodiments are most of the time symmetric with respect to a line through the centre of gravity. Although this may be preferred, it is not required for the invention. The same applies to shown gaps that are most of the time equal due to a choice of magnets having similar characteristics. However, a system in which magnets have different characteristics leading to different gaps between magnets is also envisaged.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A method for positioning a first stage with respect to a reference object, the first stage moveable relative to a second stage, the second stage moveable with respect to a frame in a moving direction using a main actuator arranged between the second stage and the frame for applying a force to the second stage with respect to the frame in the moving direction, the first stage being moveable in the moving direction between a first and a second position relative to the second stage, the method comprising:
   positioning the first stage with respect to the reference object at or near a desired position using a passive force system that is activated by positioning the second stage relative to the frame with the main actuator,
   wherein the passive force system is arranged between the first stage and the second stage, the passive force system comprising at least two magnet systems, each magnet system being configured to apply a force in the moving direction to the first stage with respect to the second stage in a non-contact manner, the forces resulting in a resultant force applied to the first stage in the moving direction by the passive force system, wherein a magnitude and/or a direction of the resultant force depends on the position of the first stage relative to the second stage, and wherein the first stage has a zero-force position between the first and second position in which the resultant force has a zero magnitude.

2. The method of claim 1, wherein positioning the first stage comprises at least one of:
   positioning the second stage such that the first stage is in a position between the first position and the zero-force position in which the resultant force is directed towards the zero-force position;
   positioning the second stage such that the first stage is in a position between the zero-force position and the second position in which the resultant force is directed towards the zero-force position; and
   positioning the second stage such that the first stage is in the zero-force position.

3. The method of claim 1, wherein positioning the first stage comprises at least one of:
   positioning the second stage such that the first stage is in a position between the first position and the zero-force position in which the resultant force is directed towards the first position;
   positioning the second stage such that the first stage is in a position between the zero-force position and the second position in which the resultant force is directed towards the second position; and
   positioning the second stage such that the first stage is in the zero-force position.

4. The method of claim 1, wherein a magnet system is configured to apply a force to the first stage that is opposite to a force applied to the first stage by another magnet system.

5. The method of claim 1, wherein the passive force system is used for coarse positioning of the first stage with respect to the reference object, and a second actuator is configured to apply a force to the first stage with respect to the second stage for fine positioning of the first stage with respect to the reference object.

6. The method of claim 1, wherein the second stage is a main stage and the first stage is a substage of the main stage.

7. The positioning system of claim 6, wherein each of the magnet systems comprises a first stage magnet assembly attached to the first stage and a second stage magnet assembly attached to the second stage.

8. The positioning system of claim 7, wherein the first stage magnet assembly and the second stage magnet assembly are configured to attract each other.

9. The positioning system of claim 8, wherein the first stage magnet assembly and the second stage magnet assembly of the at least two magnet systems each comprise at least one permanent magnet.

10. The positioning system of claim 7, wherein the first stage magnet assembly and the second stage magnet assembly of the at least two magnet systems are oriented opposite to each other in the moving direction.

11. A positioning system comprising:
   a first and a second stage, the second stage being moveable with respect to a frame in a moving direction, and the first stage being moveable in the moving direction between a first and a second position relative to the second stage;
   a main actuator configured to apply a force to the second stage with respect to the frame in the moving direction;
   a passive force system arranged between the first stage and the second stage, the passive force system comprising at least two magnet systems, each magnet system being configured to apply a force in the moving direction to the first stage with respect to the second stage in a non-contact manner, the forces resulting in a resultant force applied to the first stage in the moving direction by the passive force system, wherein a magnitude and/or a direction of the resultant force depends on the position of the first stage relative to the second stage, and wherein the first stage has a zero-force position between the first and second position in which the resultant force has a zero magnitude, and
   a controller configured to position the first stage with respect to a reference object at or near a desired position using the passive force system that is activated by positioning the second stage relative to the frame with the main actuator.

12. The positioning system of claim 11, wherein the controller is configured to position the second stage relative to the frame such that the first stage is in one of the following positions:
   a position between the first position and the zero-force position in which the resultant force is directed towards the zero-force position;
   a position between the zero-force position and the second position in which the resultant force is directed towards the zero-force position; and
   the zero-force position.

13. The positioning system of claim 11, wherein the controller is configured to position the second stage relative to the frame such that the first stage is in one of the following positions:

a position between the first position and the zero-force position in which the resultant force is directed towards the first position;

a position between the zero-force position and the second position in which the resultant force is directed towards the second position; and the zero-force position.

14. The positioning system of claim 11, wherein the first stage magnet assembly and the second stage magnet assembly are configured to repulse each other.

15. The positioning system of claim 11, wherein at least one magnet system is configured to apply a force to the first stage in a direction opposite to a force applied to the first stage by at least one other magnet system.

16. The positioning system of claim 11, wherein a second actuator is provided between the first stage and the second stage to apply a force to the first stage with respect to the second stage in the moving direction for fine positioning of the first stage with respect to the reference object.

17. The positioning system of claim 11, wherein the first stage comprises a support structure for a substrate or a patterning device of a lithographic apparatus.

18. The positioning system of claim 11, wherein a stiffness of the passive force system corresponds to the rate of change of the magnitude of the resultant force with respect to a change in position of the first stage relative to the second stage, and wherein, in use, a magnitude of the stiffness is minimal in the zero-force position and increases towards the first and second position.

19. The positioning system of claim 11, wherein the first stage is supported by the second stage.

20. The positioning system of claim 11, wherein the second stage is a main stage and the first stage is a substage of the main stage.

* * * * *